(12) United States Patent
Haro

(10) Patent No.: US 11,002,779 B2
(45) Date of Patent: May 11, 2021

(54) INTEGRATED AUTOMOBILE DIAGNOSTIC AND TROUBLESHOOTING DEVICE

(71) Applicant: Miguel Haro, Blue Springs, MO (US)

(72) Inventor: Miguel Haro, Blue Springs, MO (US)

( * ) Notice: Subject to any disclaimer, the term of this patent is extended or adjusted under 35 U.S.C. 154(b) by 312 days.

(21) Appl. No.: 15/357,393

(22) Filed: Nov. 21, 2016

(65) Prior Publication Data

US 2018/0144562 A1 May 24, 2018

(51) Int. Cl.
*G07C 5/00* (2006.01)
*G01R 31/00* (2006.01)
*G07C 5/08* (2006.01)
*G01R 31/54* (2020.01)

(52) U.S. Cl.
CPC ......... *G01R 31/007* (2013.01); *G07C 5/0808* (2013.01); *G07C 5/0858* (2013.01); *G01R 31/54* (2020.01)

(58) Field of Classification Search
USPC ....................................................... 701/33.2
See application file for complete search history.

(56) References Cited

U.S. PATENT DOCUMENTS

2013/0221973 A1* 8/2013 Whisenand ........ G01R 31/1272
324/501
2015/0371461 A1* 12/2015 Treharne .............. G07C 5/0816
701/31.4
2016/0161560 A1* 6/2016 Barden .............. G01R 1/06788
324/418

* cited by examiner

*Primary Examiner* — James M McPherson
(74) *Attorney, Agent, or Firm* — Erickson Kernell IP, LLC; Mark C. Young

(57) ABSTRACT

An integrated automobile diagnostic and troubleshooting device circuitry operable to present an electrical load to a system or component under test, circuitry operable to provide an audible indication of continuity in a system or component under test, circuitry operable to provide a visual indication of current and voltage under test; and circuitry operable to provide differential output voltage to a system or component under test. In a preferred embodiment, the circuitry is integrated into a single handheld integrated housing allowing simultaneous operation of the circuitry by a single technician. In alternative embodiments, the device includes a test cable allowing remote operation and testing of an automobile system or component.

8 Claims, 4 Drawing Sheets

INTEGRATED AUTOMOBILE DIAGNOSTIC AND TROUBLESHOOTING DEVICE

BACKGROUND OF THE INVENTION

Field of the Invention

The present invention relates generally to automotive repair tools. More specifically, the invention relates to an integrated automobile diagnostic and troubleshooting device operable to assist a service technician in diagnosing, troubleshooting, and repairing electrical systems and components of automobiles.

Background & Description of the Related Art

Cars, trucks, and other automobiles continue to be a preferred form of transportation in the United States and throughout the word. Commuters rely on automobiles to transport them to and from work, businesses rely on automobiles or trucks to transport people and goods throughout cities and across the country, and families rely on automobiles as transport for vacations and other recreational activities. The manufacture and sale of automobiles throughout the world has continued to grow since the first mass production of such vehicles began in the early nineteen-hundreds.

As the automobile industry has grown, the associated technology has likewise evolved and developed. In particular, the integration of advanced computers and electronics into automobiles has resulted in cars and trucks that are generally much more fuel efficient and much more reliable than automobiles built thirty years ago.

Engines and drivetrains in modern automobiles rely on controllers or computers to monitor inputs from various sensors located throughout the engine and drivetrain, and to control various outputs to those systems. The functionality of power windows, power seats, heaters, radios, entertainment centers and the like in modern automobiles all rely on complex electronics and computerized systems.

While beneficial, that advanced technology has resulted in automobile systems that are generally more difficult to repair than in the past, both from the standpoint of the complexity and from the standpoint of more physical components being packed into smaller areas—leaving less room to access and work on those components. Thus, while more reliable, modern automotive systems are often difficult to diagnose and repair without specialized tools capable of communicating with the numerous controllers and computers implemented in modern automobiles.

Recognizing the complexity and the need for repair tools for troubleshooting modern automotive systems, the automobile industry and manufacturers developed on-board diagnostic (OBD) systems and communications protocols that are used to detect and report various system faults and that allow repair technicians to have some access and insight into the operation of the controllers used throughout the automobile systems.

While those OBD tools have provided necessary capability to repair technicians with respect to communication with the various on-board controllers, those tools are typically capable only of providing general diagnostic recommendations, and often do not pinpoint the underlying problem. For example, an OBD code indicating a detected failed oxygen (O2) sensor cannot typically distinguish between an open circuit in the sensor itself and an open circuit in the wiring harness connecting to the sensor. And, the OBD tool has no capabilities for troubleshooting the wiring harness itself.

Similarly, the OBD diagnostic codes are effective only with respect to systems that are integrated into the OBD system and controllers. Some automobile electrical subsystems, such as power seats, windows, or other accessory items, do not typically have integrated OBD diagnostic capabilities.

The general nature of OBD diagnostics and the lack of diagnostic and troubleshooting tools for non-OBD systems often results in the unnecessary replacement of parts as repair technicians have no data to rely on and simply swap out suspected bad parts. For example, an OBD code indicating a bad O2 sensor typically results in a repair technician replacing the sensor, only to realize after doing so that the sensor itself is not the problem—the problem is in the wiring harness. Similarly, a technician working on a power seat that fails to operate may simply swap out the seat motor or switch before realizing that the wiring harness, not the motor or switch, is the problem.

Thus, it can be seen that there remains a need in the art for a tool that allows an automotive repair technician to diagnose and troubleshoot simple and complex electrical components and wiring with accuracy and certainty not provided by OBD systems or other known automotive testing devices.

SUMMARY OF THE INVENTION

The present invention is directed to an integrated automobile diagnostic and troubleshooting device configured to be operated by a single automotive repair technician in diagnosing, troubleshooting, and repairing problems with the electrical systems and components of an automobile.

In one aspect, the integrated automobile diagnostic and troubleshooting device of the present invention includes circuitry comprising various test instruments and troubleshooting devices integrated into a single case for easy operation by an automotive repair technician working alone without assistance from other technicians. In one exemplary embodiment, the circuitry includes measurement circuitry comprising voltage measuring and indicating circuitry for measuring voltages within the electrical systems or components of the automobile under test and current measuring circuitry for measuring current within the electrical systems or components of the automobile under test, load circuitry for applying a current-drawing load into or across the electrical systems or components of the automobile under test, continuity circuitry for detecting the continuity of a portion of the electrical systems or components of the automobile under test, and motor control circuitry for applying a differential voltage output to the electrical systems or components of the automobile under test.

In another aspect, the automobile diagnostic and troubleshooting device of the present invention includes power circuitry comprising a battery for supplying power to the internal circuitry of the device and for applying power to the electrical systems or components of the automobile under test.

In another aspect, the automobile diagnostic and troubleshooting device of the present invention includes a plurality of switches configured to selectively connect the various test and diagnostic circuitry to the electrical systems or components of the automobile under test.

In yet another aspect, the automobile diagnostic and troubleshooting device of the present invention includes one or more fuses to selectively protect and isolate the various test and diagnostic circuitry and the electrical systems and components of the automobile under test.

In another aspect automobile diagnostic and troubleshooting device of the present invention comprises one or more remote cables in communication with the test and diagnostic circuitry. The remote cables are configured to interface to the electrical systems and components of the automobile under test to allow a single technician to remotely control, operate, and view parameters of the electrical systems and components of the automobile under test.

DETAILED DESCRIPTION OF EXEMPLARY EMBODIMENTS

Various embodiments of the present invention are disclosed herein, it is to be understood that the disclosed embodiments are merely exemplary of the invention, which may be embodied in various forms. Thus, any specific structural and functional details disclosed herein are not to be interpreted as limiting, but merely as a basis for the claims and as a representative basis for teaching one skilled in the art to variously employ the present invention in virtually any appropriately detailed structure. The drawings constitute a part of this specification and include exemplary embodiments of the present invention and illustrate various objects and features thereof.

Certain terminology used in the following description is for convenience in reference only and is not limiting. For example, the words "vertically", "horizontally", "vertical", "horizontal" and "upwardly", "downwardly", "upper", "lower" all refer to the installed position of the item to which the reference is made. The words "inwardly" and "outwardly" refer to directions toward and away from, respectively, the geometric center of the embodiment being designated and parts thereof. The terminology used herein may include the words specifically mentioned, derivatives thereof and words of a similar import. It is further understood that terminology such as the aforementioned directional phrases may be used to describe exemplary embodiments of the automobile diagnostic and troubleshooting device as shown in the figures herein. This is for convenience only as it is understood that the exemplary embodiments of the device described may also be oriented or arranged in other manners than those explicitly described.

Figure 1:
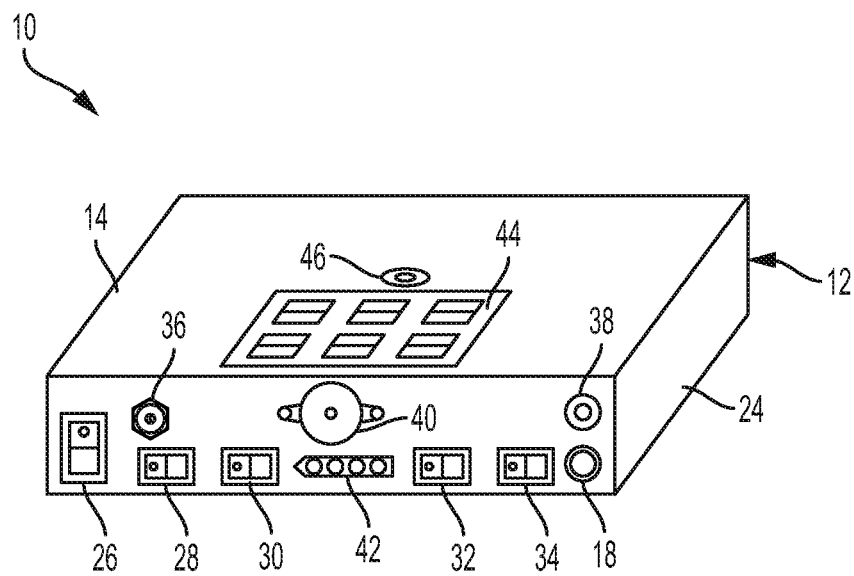
FIG. 1 is a perspective view of an automobile diagnostic and troubleshooting device in accordance with an exemplary embodiment of the present invention.
Figure 2:
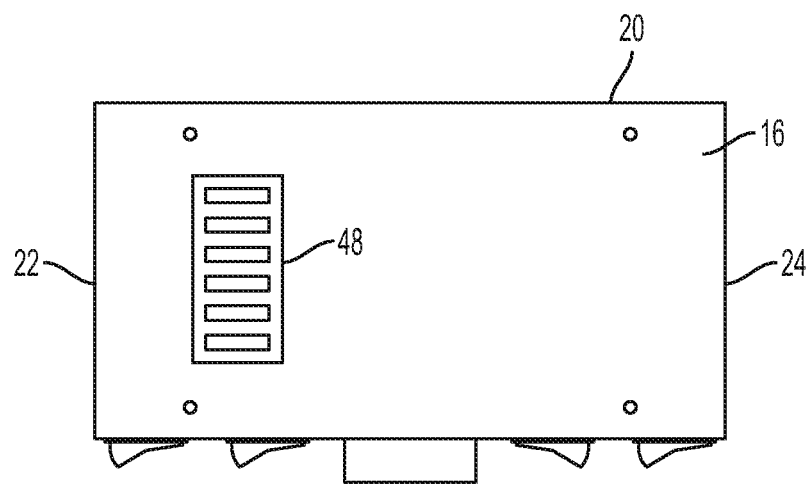
FIG. 2 is a bottom view of the automobile diagnostic and troubleshooting device of FIG. 1.

Looking first to FIGS. 1 and 2, a perspective view of an automobile diagnostic and troubleshooting device in accordance with an exemplary embodiment of the present invention is designated generally by the numeral 10. The device includes a rectangular case 12 having top 14 and bottom 16 panels, with front 18, rear, 20, and left 22 and right 24 side panels completing the enclosure and defining an interior space for housing internal power and test and diagnostic circuitry as will be described in more detail below. As is known in the art, the bottom panel 16 is removably attached via screws or other fastening mechanism to allow access to the interior of the housing.

Various displays, input and output connectors, operator control switches, and other portions of the test and diagnostic circuitry are positioned along the top 14 and front 18 panels of the case to allow operation of the enclosed circuitry and connection of that circuitry to the automobile under test. Those displays, connectors, switches, and circuitry will be described briefly here, the operation of each will be described in more detail below.

Looking to FIG. 1, a series of five rocker switches along the front panel are operable to: (1) turn the entire unit on and off by connecting and disconnecting the power circuitry within the unit to and from the other circuitry (switch 26); (2) selectively connect or disconnect the load circuitry within the unit (switch 28) to the electrical system or component of the automobile under test; (3) selectively connect the continuity circuitry within the unit (switch 30) to the electrical system or component of the automobile under test; (4) selectively connect the motor control circuitry (switch 32) to the electrical system or component of the automobile under test; and (5) selectively reverse the polarity of the output of the motor control circuitry (switch 34). The switches are preferably rocker type switches, with the leftmost switch being the unit power on/off switch 26 oriented in a vertical position, the remaining switches are preferably oriented horizontally.

A two-conductor coaxial power input connector 36 is positioned at the left side of the front panel and is configured to accept input power from an external power supply, such as an external battery, AC to DC converter, or other power supply as will be discussed in more detail below. The power input connector is in electrical communication with the internal battery of the unit and is operable to charge the internal battery of the device. A power output connector 38 comprising two banana jack type connectors is positioned at the right-hand side of the front panel. The power output connector is in electrical communication with the internal battery, allowing the battery power to be accessed through the connector to power external devices.

A buzzer unit 40 is positioned near the top center of the front panel. The buzzer is operable to provide an audible signal in response to a control signal from the continuity circuitry and depending on the position of the continuity circuitry switch 30.

A four-pin input/output connector 42 is positioned near the lower center portion of the front panel. The input/output connector provides a ground level input/output pin, a high-level input/output pin, and two pins providing simultaneous opposite polarity outputs (e.g., gnd/+ and +/gnd, or +/gnd and gnd/+) for connecting to and testing electrical components having reversible operation, such as window motors or power seat motors via the motor control circuitry. The four-pin connector 42 is configured to receive a four-conductor test cable having a mating connector to provide voltage to remote electrical systems and components and to measure voltages and currents in those systems and components. The test cable allows a single technician using the device to remotely operate and/or control electrical systems and components of an automobile under test.

The device connection end of the test cable preferably includes an opposite polarity mating connector configured to plug in to connector 42, with the distal opposite end of the test cable having pins, receptacles, clips, or other desired connecting means to allow any combination of each of the four conductors to be connected to a plug, receptacle, wire, pin, or other attachment point on an electrical system or component undergoing test. Most preferably, the opposite end of the test cable includes a connector allowing a variety of adapters having various connecting means attached, allowing an operator to quickly connect the appropriate adapter. With a test cable connected to a device or system under test, an automotive technician can remotely operate and/or monitor the device or system, without the assistance of a second technician to relay measurement information or hold test leads in place.

In alternative embodiments, the test leads or test cable and/or the power cables may be configured with banana plugs configured to plug into corresponding banana jacks on the device, the test leads may be self-retractable type leads. In further embodiments, the test leads and/or the power supply cables may be simple lamp cord or zip cord with appropriate connectors at each end for connection to the device.

A digital numeric ammeter and voltmeter display 44 is positioned along the center front edge of the top panel. The digital display is a part of the measurement circuitry and is operable to display voltage and current readings of the automobile system or component under test. An indicator light 46, part of the load circuitry, is positioned on the top panel, adjacent the digital display, the indicator operable to visually indicate the state of an automobile circuit or component under test and further operable to provide an electrical load to that circuit or component.

Turning to FIG. 2, a series of fuses 48 associated with the various internal circuitry of the device are accessible through an access opening on the bottom panel of the device for easy replacement by an operator of the device.

It should be understood that the configuration of the automobile diagnostic and troubleshooting device in FIGS. 1 and 2 is exemplary, and is not limiting. For example, the case may be configured in different arrangements, such as being configured within a narrower, thinner case. And the arrangement of the switches, controls and displays may be varied. For instance, all the switches, displays, and fuses may be arranged or positioned on the top panel, rather than along the front panel. These and other variations are within the scope of the present invention.

Looking now to FIGS. 3 and 4, the circuitry and operation of the device will be described with reference back to the corresponding physical components of FIGS. 1 and 2.

Figure 3:
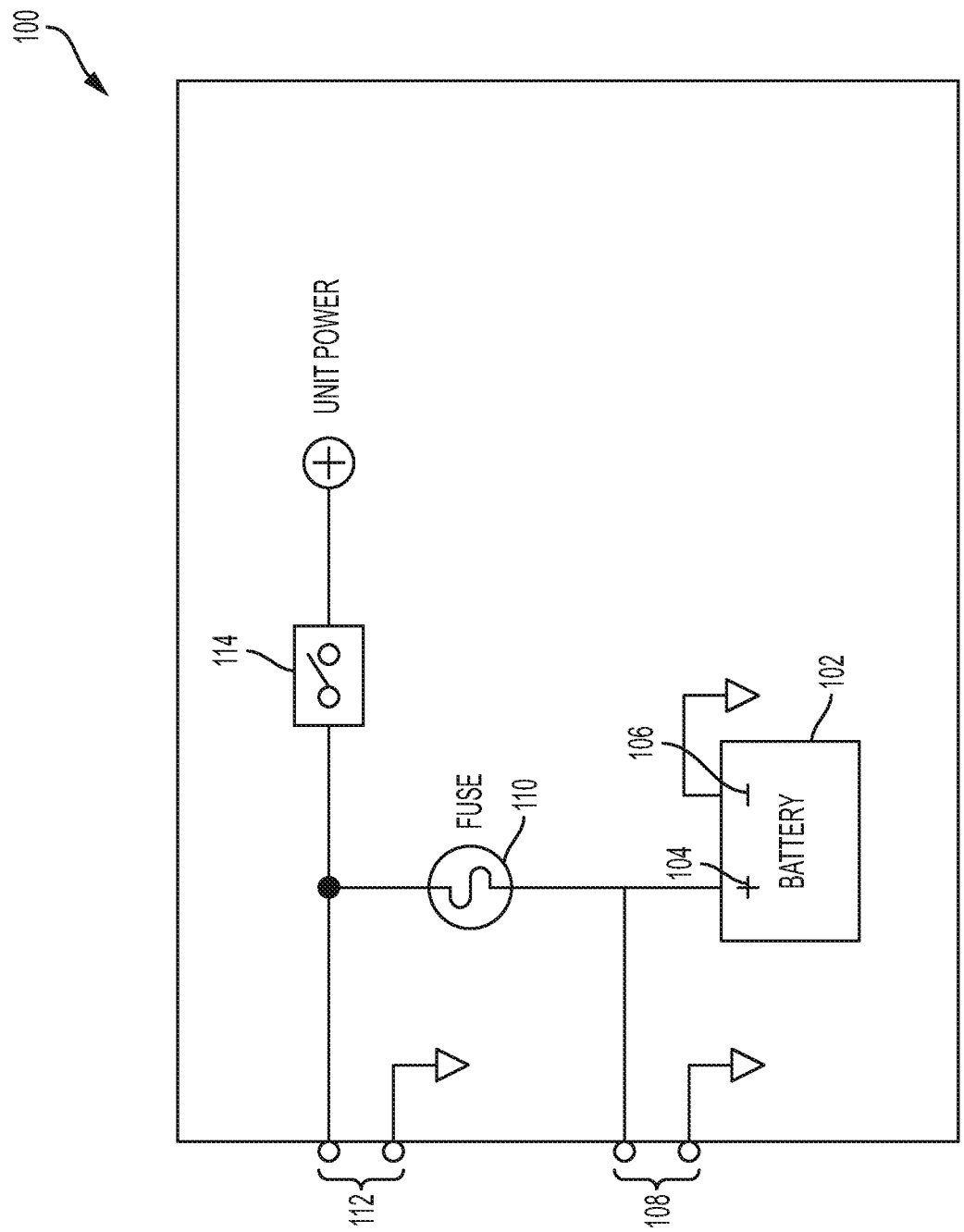
FIG. 3 is a block diagram of the power circuitry and battery portion of an automobile diagnostic and troubleshooting device in accordance with an exemplary embodiment of the present invention.

As seen in FIG. 3, a block diagram of the power supply portion and power circuitry of the device is depicted generally by the numeral 100. The power supply includes a battery 102 having a positive 104 and negative 106 terminal. As is known in the art, the negative terminal of the battery is connected to a common ground bus depicted by the ground terminal symbol. For clarity in the drawings it will be understood that all ground references are to the same ground bus to which the negative terminal of the battery is connected.

A power in connector 108 (corresponding to the power input connector 36 in FIG. 1) allows an external power supply to be connected to the battery positive and ground terminals such that the battery can be charged. Preferably, the external power supply provides approximately 12 to 15 volts direct current (DC) to the battery and is appropriately regulated to limit the charge current. The power input connector may be any type of connector known in the art, preferably it is a jack configured to accept a two-conductor plug type supply connector.

In alternative embodiments of the present invention charging circuitry may be built into the device, allowing, for example, an external AC power supply to be connected to charge the internal battery, with the charging circuitry having appropriate voltage and current regulation, and isolation circuitry to protect the device from the external AC supply. In further embodiments, the device may have no internal battery, with power supplied via connection to an external battery or power supply, allowing the size of the device to be minimized.

The battery positive terminal is connected through fuse 110 to a power out connector 112 (corresponding to the power output connector 38 of FIG. 1) to allow the internal battery power to be connected to an external device. The battery power is further provided to the unit power switch 114 (corresponding to the unit power switch 26 of FIG. 1) which thus controls the power to the remainder of the circuitry in the device. Preferably unit power switch 114 is a single pole, single throw rocker switch, although other switches known in the art may be used. The unit power distributed to the remainder of the circuitry in the device is depicted as a plus sign (+) in a circle, it should be understood that same symbol represents the unit power in the subsequent drawings.

Figure 4:
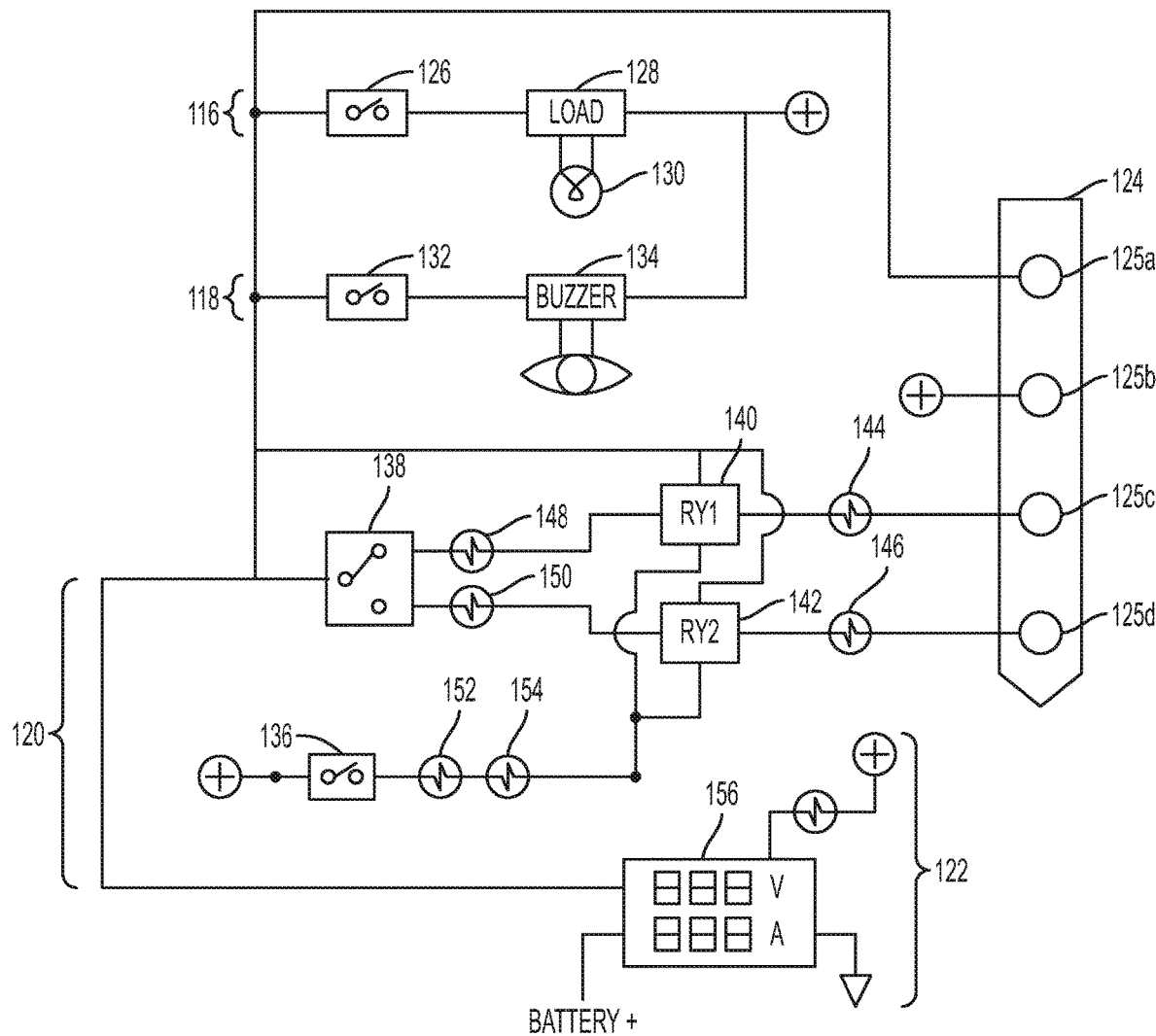
FIG. 4 is a block diagram of test and diagnostic circuitry of an automobile diagnostic and troubleshooting device in accordance with an exemplary embodiment of the present invention.

Turning to FIG. 4, a block diagram of the test and diagnostic circuitry of an automobile diagnostic and troubleshooting device in accordance with an exemplary embodiment of the present invention is depicted. It should be understood that the operational circuitry depicted in FIG. 4 derives power from the power supply circuitry depicted in FIG. 3.

As seen in FIG. 4, the circuitry generally comprises load circuitry 116, continuity circuitry 118, motor control circuitry 120, and measurement circuitry 122. Input and output connections to the circuitry are accomplished through input/output connector 124 (corresponding to input/output connector 42 in FIG. 1), having four pins 125a, 125b, 125c, 125d corresponding to the four pins on the input/output connector 42 of FIG. 1.

The load circuitry 116 comprises a load switch 126 in communication with pin 125a of connector 124, and in further communication with load circuitry 128. The load circuitry 128 is further in communication with the positive power supply voltage. The load circuitry 128 preferably comprises an incandescent light bulb 130 operable to draw current in response to an applied voltage. Light bulb 130 corresponds to the light indicator 46 in FIG. 1. In operation, a system or component under test is connected to pin 125a of connector 124. Assuming one side of the system or component is grounded, closing load switch 126 allows an operator to effectively insert the load circuitry 128 in series with the system or component such that current flows through the load circuitry and the system or component under test. The light bulb 130 thus serves as a visual indication of the completed circuit, and further serves to draw current through the circuit to simulate an actual load on the system or component.

Thus, for example, in testing a suspected bad wire in a wiring harness of an automobile under test, the test cable of the device is connected to the harness or associated electrical system or component. A technician using the device can insert the load circuitry into the system or component under test using switch 126. The load circuitry of the device presents a current draw on the harness, system, and/or component that simulates an in-use load condition. Such load testing can reveal faults in the wire that cannot necessarily be detected by a simple continuity test or by a test with an ohmmeter—which typically present minimal load to the circuit under test. In addition to presenting an electrical load to the system or component under test, the light bulb 130 of the load circuitry provides a visual indication of the operation and status of the system or component under test. In alternative embodiments, the load circuitry may include other, or additional, loads, such as resistive or inductive components to simulate particular types of loads. These and other variations are within the scope of the present invention.

The continuity circuitry 118 comprises a continuity switch 132 in communication with pin 125*a* of connector 124, and in further communication with buzzer 134. The buzzer is further in communication with the positive power supply voltage. The buzzer 134 preferably comprises an audible buzzer to provide an alert to an operator. Buzzer 134 corresponds to the buzzer unit 40 in FIG. 1. In operation, a wire, system, or component under test is connected to pin 125*a* of connector 124. Assuming one side of the wire, system, or component is grounded, closing the continuity switch 126 allows an operator to test the continuity of the wire, system, or component as the buzzer will operate when the circuit is completed. In alternative embodiments, a piezo buzzer, beeper, or other noise generating device may be used to provide an audible indication of continuity.

The motor control circuitry 120 comprises a motor power switch 136 and a motor reverse switch 138 (corresponding to switches 32 and 34 in FIG. 1), and two double-pole, double-throw relays 140, 142 in communication with each switch. The output or common terminal of each relay is in communication with corresponding pins 125*c*, 125*d* on input/output connector 124, with a fuse 144, 146 in line with each relay output. Fuses 148, 150 are similarly positioned between the outputs of the motor reverse switch 138 and each relay 148, 150, with two fuses 152, 154 inline between the motor power switch 136 and the connection to both relays.

Motor power switch 136 is operable to provide positive battery voltage to each relay 140, 142 as output power to pins 125*c*, 125*d* for powering a direct current (DC) motor under test. Motor reverse switch 138 is a single pole, double throw switch, operable to activate and deactivate relays 140, 142 simultaneously. With motor reverse switch 138 in a first position, relay 140 is activated and relay 142 is deactivated, and with motor reverse switch 138 in a second position, relay 140 is deactivated and relay 142 is activated. With positive voltage supplied to the relays through the motor power switch 136, the relay outputs each switch between positive and ground in response to motor reverse switch 138.

Thus, for example, with the motor power switch 136 on and the motor reverse switch 138 in a first position, the output of the first relay 140 is positive voltage and the output of the second relay 142 is ground. With the motor power switch 136 moved to a second position, the output of the first relay 140 is ground, and the output of the second relay 142 is positive voltage. Thus, the combined output of the two relays is a differential output, with either one leg positive and the other ground, or one leg ground and the other positive.

With pins 125*c* and 125*d* connected via a test cable to a motor under test, such as a power window motor or power seat motor, a single technician operating the device can test the motor by selecting the desired movement of the motor (e.g., up or down) using motor reverse switch 138 and applying power to the motor test circuitry using motor power switch 136. The output power to pins 125*c* and 125*d*, and thus to the motor connected via a test harness, will then be reversible to allow the operator to move the motor up and down using motor reverse switch 138. Because motors typically draw high currents during operation, fuses 144, 146, 148, 150, 152, and 154 all act within the motor control circuitry to protect the circuitry of the device, the motor under test, and the wiring of the automobile.

In alternative embodiments, the test and diagnostic circuitry may be further integrated to allow replacement of the four-pin input/output connector 124 with a two-pin connector. In that alternative embodiment, the input/output lines may be multiplexed to allow operation over a common input/output line, or may be switched within the device. These and other embodiments are within the scope of the present invention.

Measurement circuitry 122 comprises an integrated voltmeter and ammeter 156 operable to display measured voltage and current parameters. Thus, for example, in operating the motor control circuitry as just described, the system voltage and the current draw of the motor during operation will be displayed on the meter 156.

Preferably, the battery is rated at 12 volts direct current (DC) with the capability of providing at least 20 amps of current for short periods of time. In alternative embodiments, the battery can be different voltage, e.g., for use with vehicles having other than 12-volt DC systems, likewise the battery can have higher or lower current ratings depending on the types of systems being tested. Similarly, the size and capacity of the battery can be varied depending on the desired case size or unit weight.

It should be understood that the various test circuitry—the load, continuity, and motor control circuitry—is generally intended to be operated separately, not simultaneously. Thus, for example, an operator would typically operate test switch 126 alone while performing a specific test, and would operate continuity switch 132 alone in performing a different test—the operator would normally not operate both switches at the same time. Similarly, an operator would not normally operate the motor test circuitry at the same time as operating the load circuitry or the buzzer circuitry. In alternative embodiments of the present invention, the switches may be mechanically interlocked to allow operation of only a single switch or desired combination of switches simultaneously. In other embodiments, additional circuitry may be included to electronically limit simultaneous operation of the various test circuitry. These and other variations are within the scope of the present invention.

Figure 5:
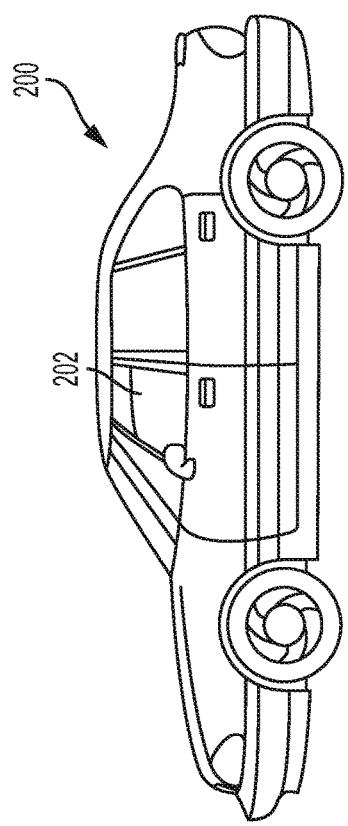
FIG. 5 is a perspective view of an automobile undergoing test using an automobile diagnostic and troubleshooting device in accordance with an exemplary embodiment of the present invention.
Figure 6:
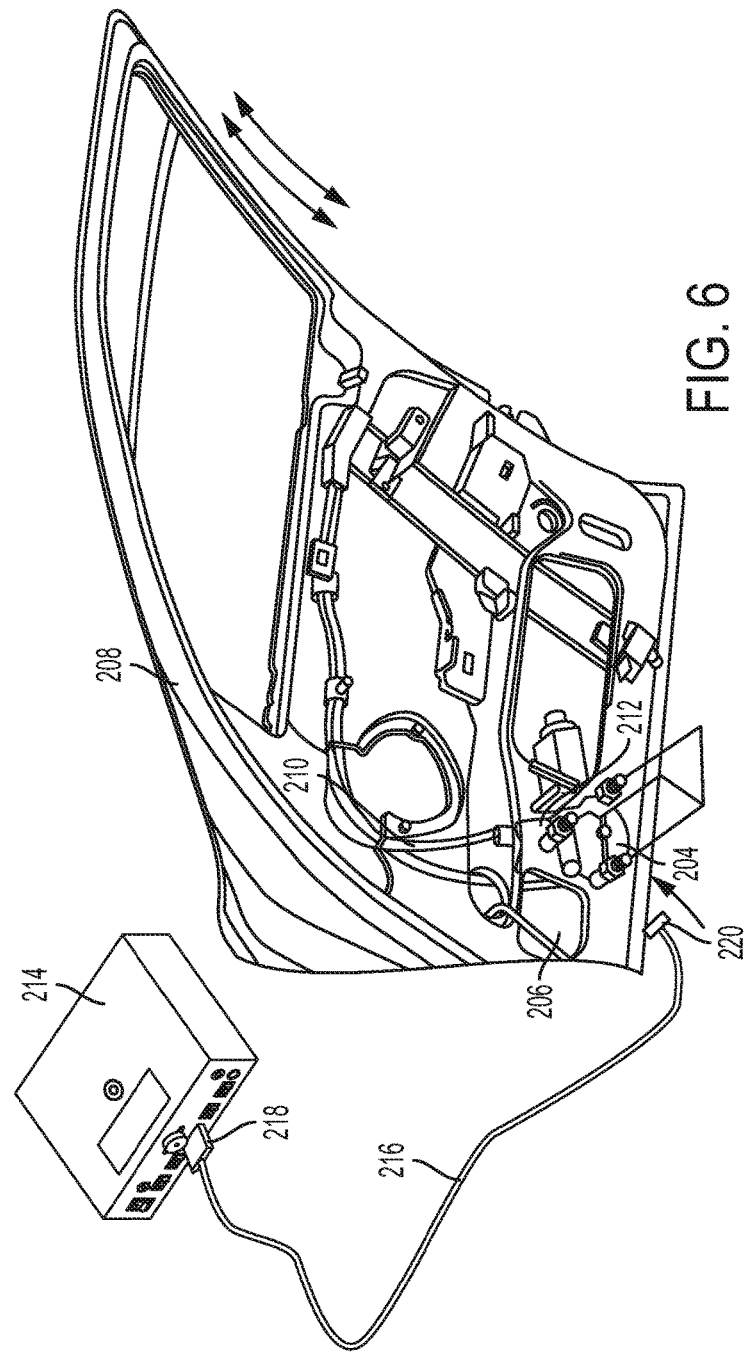
FIG. 6 is a perspective view of the automobile diagnostic and troubleshooting device of FIG. 1 having a cable allowing a single technician to remotely operate and troubleshoot an electrical system or component of an automobile under test.

Turning to FIGS. 5 and 6, the operation of the device in conjunction with an exemplary diagnostic and troubleshooting embodiment is depicted. As seen in FIG. 5, an automobile 200 having a problem with the operation of a power window component 202 is depicted.

Looking to FIG. 6, with the interior door panel removed, access to the window motor or actuator 204 is allowed. The motor 204 is typically mounted within the cavity 206 of a door 208, with the automobile wiring harnesses 210 and connectors 212 not easily accessible. In the past, troubleshooting of the motor would require one technician to attempt to use a meter or other test device directly at the motor, while another technician operated the window power button, often located on the center console of the car. Such testing is labor intensive, requiring at least two technicians to perform, and is also unsafe, as one technician is positioned directly at the motor as it operates. As depicted in FIG. 6, using the device of the present invention a single operator can remotely test and operate the motor.

As seen in FIG. 6, an automobile diagnostic and troubleshooting device 214 accordance with an exemplary embodiment of the present invention includes an attached test cable 216, having a connector 218 at the device end of the cable configured to plug in to the four-pin input/output connector on the device as previously described. An adapter connector 220 at the remote end of the test cable 216 is configured with pins, receptacles, clips, or other connectors allowing the cable to be connected to the wiring harness 210 or connectors 212 at the window motor 204. It should be understood that various adapter connectors may be used in conjunction with the test cable 216. For example, a general test cable having alligator clips or pigtail wires may be used to attach to wires or pins, or a specific adapter cable configured with a connector specifically designed to interface with the motor connector 212 may be used.

With the test cable attached to the motor's power control, a single technician can use the device 214 to remotely operate the motor in a manner similar to that previously described. Thus, a technician would apply power to the motor control circuitry using switch 136, and would control the direction of the motor using the motor reverse switch 138. As the motor was operating, the technician could simultaneously monitor the voltage of the system and the current draw of the motor using the digital display of the device.

The automobile diagnostic and troubleshooting device of the present invention thus allows a single technician to single handedly perform testing and operation of an automobile system or component, and to obtain corresponding voltage and current readings, all from a remote location. Thus, the device of the present invention saves labor costs and time by a allowing a single technician to diagnose and troubleshoot problems, and increases the safety of the technician by allowing remote operation of moving components. The device further allows simultaneous monitoring of voltage and current readings as the component is undergoing testing.

It should be understood that while certain forms and embodiments have been illustrated and described herein, the present invention is not to be limited to the specific forms or arrangement of parts described and shown, and that the various features described may be combined in ways other than those specifically described without departing from the scope of the present invention. The terms "substantially", "generally", "approximately", or any other qualifying term as used herein may be applied to modify any quantitative representation which could permissibly vary without resulting in a change to the basic function to which it is related.

What is claimed is:

1. An integrated automobile diagnostic and troubleshooting device, comprising:
   test and diagnostic circuitry, comprising:
   (a) load circuitry configured to present an electrical load to a system or component of a vehicle undergoing testing such that the load circuitry draws current through the system or component to simulate operation of the system or component under load;
   (b) continuity circuitry configured to interface to and provide audible indication of electrical continuity of a system or component under test,
   (c) measurement circuitry configured to interface to and provide indication of voltage and current levels in a system or component under test,
   (d) control circuitry configured to interface to and to apply a voltage to the system or component under test;
   (e) power circuitry comprising an internal battery for supplying power to the test and diagnostic circuitry and to the system or component undergoing testing, wherein the internal battery is connected to a power output connector to supply power to the system or component of the vehicle undergoing testing; and
   (f) a portable case containing the test and diagnostic circuitry such that a single operator can troubleshoot and diagnose said system or component under test by operating said test and diagnostic circuitry.

2. The device of claim 1, further comprising a plurality of switches in communication with said test and diagnostic circuitry, said plurality of switches configured to selectively connect and disconnect portions of said test and diagnostic circuitry to said system or component under test.

3. The device of claim 1, further comprising at least one external connector in communication with said test and diagnostic circuitry, wherein said external connector is configured to provide an interface connection to said system or component under test.

4. The device of claim 3, further comprising a test cable in communication with said test and diagnostic circuitry and configured to connect to said system or component under test.

5. The device of claim 4, wherein said test cable is configured to mate to said external connector.

6. The device of claim 1, wherein said load circuitry comprises:
   resistive loads, inductive loads, and combinations thereof.

7. The device of claim 1, wherein said measurement circuitry comprises audible indicators, visual indicators, and combinations thereof.

8. The device of claim 1, wherein said power circuitry comprises circuitry operable to charge said internal battery.

* * * * *